United States Patent
Lin et al.

(10) Patent No.: US 8,390,119 B2
(45) Date of Patent: Mar. 5, 2013

(54) FLIP CHIP PACKAGE UTILIZING TRACE BUMP TRACE INTERCONNECTION

(75) Inventors: Tzu-Hung Lin, Hsinchu County (TW); Thomas Matthew Gregorich, San Diego, CA (US)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 17 days.

(21) Appl. No.: 13/110,932

(22) Filed: May 19, 2011

(65) Prior Publication Data

US 2012/0032322 A1  Feb. 9, 2012

Related U.S. Application Data (60) Provisional application No. 61/371,291, filed on Aug. 6, 2010.

(51) Int. Cl.
*H01L 23/52* (2006.01)

(52) U.S. Cl. ........... 257/738; 257/777; 257/E23.008

(58) Field of Classification Search .......... 257/737, 257/778, E23.008, 738.777, 782, 784
See application file for complete search history.

(56) References Cited

U.S. PATENT DOCUMENTS

| | | | |
|---|---|---|---|
| 2005/0077624 A1* | 4/2005 | Tan et al. | 257/737 |
| 2006/0079009 A1* | 4/2006 | Salmon et al. | 438/14 |
| 2011/0101527 A1* | 5/2011 | Cheng et al. | 257/738 |

FOREIGN PATENT DOCUMENTS

| | | |
|---|---|---|
| CN | 1501490 A | 6/2004 |
| JP | 11135532 A | 5/1999 |

\* cited by examiner

*Primary Examiner* — Thomas L Dickey
*Assistant Examiner* — Nikolay Yushin
(74) *Attorney, Agent, or Firm* — Winston Hsu; Scott Margo (57) ABSTRACT

A flip chip package includes a substrate having a die attach surface; and a die mounted on the die attach surface with an active surface of the die facing the substrate, wherein the die is interconnected to the substrate via a plurality of copper pillar bumps on the active surface, wherein at least one of the plurality of copper pillar bumps has a bump width that is substantially equal to or smaller than a line width of a trace on the die attach surface of the substrate.

20 Claims, 7 Drawing Sheets

FLIP CHIP PACKAGE UTILIZING TRACE BUMP TRACE INTERCONNECTION

CROSS REFERENCE TO RELATED APPLICATIONS

This application claims the benefit of U.S. provisional application No. 61/371,291 filed Aug. 6, 2010.

BACKGROUND OF THE INVENTION

1. Field of the Invention

The present invention relates generally to flip chip technology. More particularly, the present invention relates to a flip chip package utilizing trace bump trace (TBT) interconnection.

2. Description of the Prior Art

In order to ensure miniaturization and multi-functionality of electronic products or communication devices, semiconductor packages are required to be of small in size, multi-pin connection, high speed, and high functionality. Increased Input-Output (I/O) pin count combined with increased demands for high performance ICs has led to the development of flip chip packages.

Flip-chip technology uses bumps on chip to interconnect the package media such as package substrate. The flip-chip is bonded face down to the package substrate through the shortest path. These technologies can be applied not only to single-chip packaging, but also to higher or integrated levels of packaging in which the packages are larger and to more sophisticated substrates that accommodate several chips to form larger functional units. The flip-chip technique, using an area array, has the advantage of achieving the higher density of interconnection to the device and a very low inductance interconnection to the package.

Figure 1:
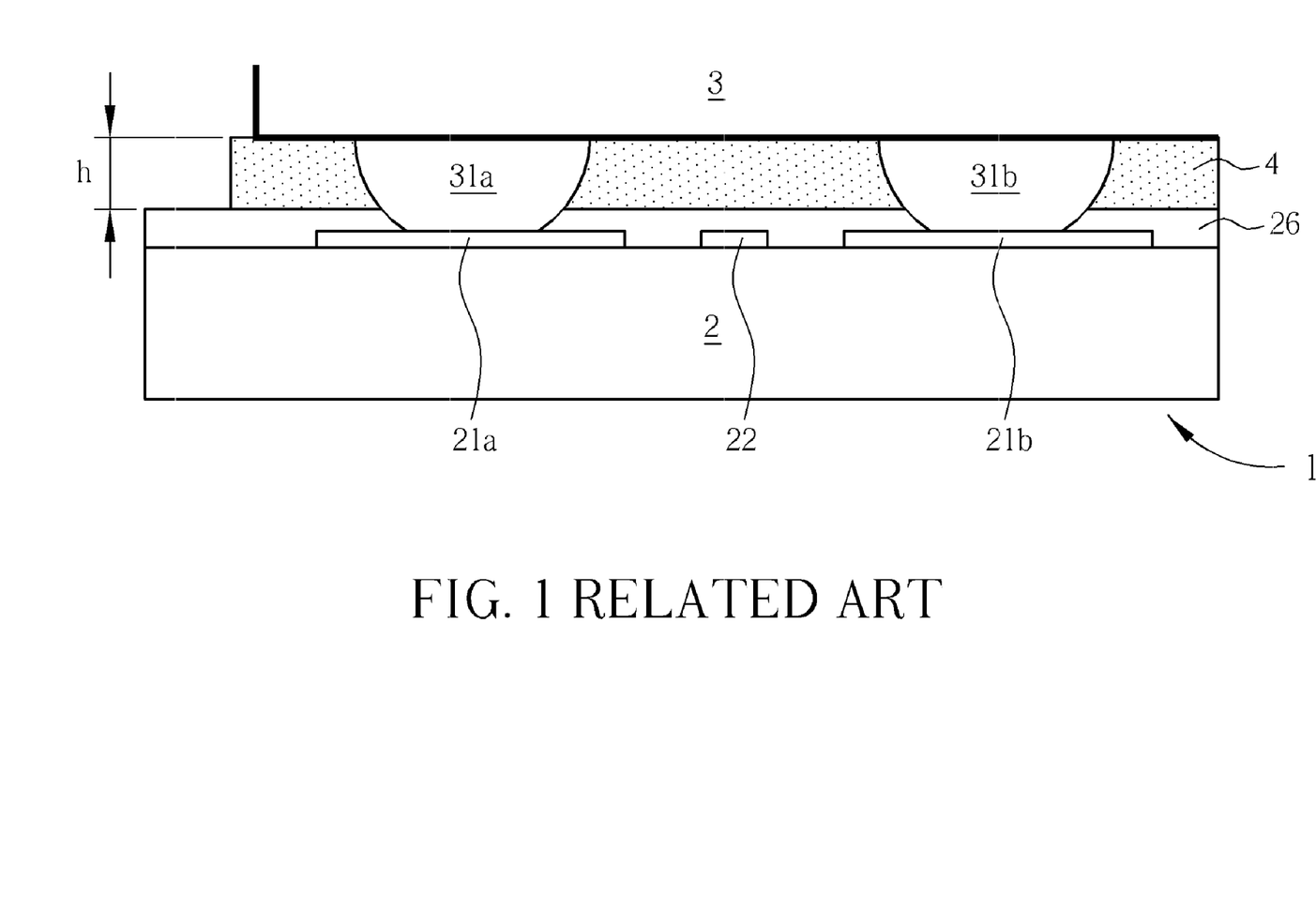
FIG. 1 is a schematic, cross-sectional diagram showing a portion of a conventional flip chip package utilizing solder ball interconnection.

FIG. 1 shows a portion of a conventional flip chip package in a diagrammatic sectional view. As shown in FIG. 1, the conventional flip chip package 1 is made by using a "bump-on-capture pad" (BOC) interconnect scheme. At least two adjacent capture pads 21a and 21b and a metal trace 22 are disposed on a die attach surface of the package substrate 2. A solder mask 26 covers the die attach surface of the package substrate 2. The solder mask 26 has solder mask defined (SMD) openings corresponding to the capture pads 21a and 21b for confining the flow of solder during the interconnection process.

Interconnection solder bumps 31a and 31b disposed on the active side of the die 3 are joined to the exposed capture pads 21a and 21b respectively. After performing the reflow of the interconnection solder bumps 31a and 31b, an underfill material 4 is typically introduced into the gap with stand-off height h between the substrate 2 and the die 3 to mechanically stabilizing the interconnects.

One drawback of the above-described prior art is that there is considerable loss of routing space on the top layer of package substrate 2. This is because the width or diameter of the capture pad is typically about the same as the ball (or bump) diameter, and can be as much as two to four times wider than the trace (or lead) width. Another drawback of the above-described prior art is that the small stand-off height between the die and the package substrate limits the process window, reliability and throughput when performing underfill process in the flip chip assembly flow.

SUMMARY OF THE INVENTION

It is one object of the invention to provide an improved flip chip package utilizing novel trace bump trace (TBT) interconnection, which is capable of lowering the cost in substrate and widening the process window for flip chip assembly flow.

To these ends, according to one aspect of the present invention, there is provided a flip chip package including a substrate having a die attach surface; and a die mounted on the die attach surface with an active surface of the die facing the substrate, wherein the die is interconnected to the substrate via a plurality of copper pillar bumps on the active surface, wherein at least one of the plurality of copper pillar bumps has a bump width that is substantially equal to or smaller than a line width of a trace on the die attach surface of the substrate.

From another aspect of this invention, a semiconductor die includes a base; a topmost metal layer on the base; a stress buffering layer overlying the topmost metal layer, wherein the stress buffering layer has an opening exposing at least a portion of the topmost metal layer; and a copper pillar bump coupled to the topmost metal layer through the opening. The copper pillar bump is oval-shaped from a plan view and has a bump orientation that is directed to a center of the semiconductor die.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Figure 2:
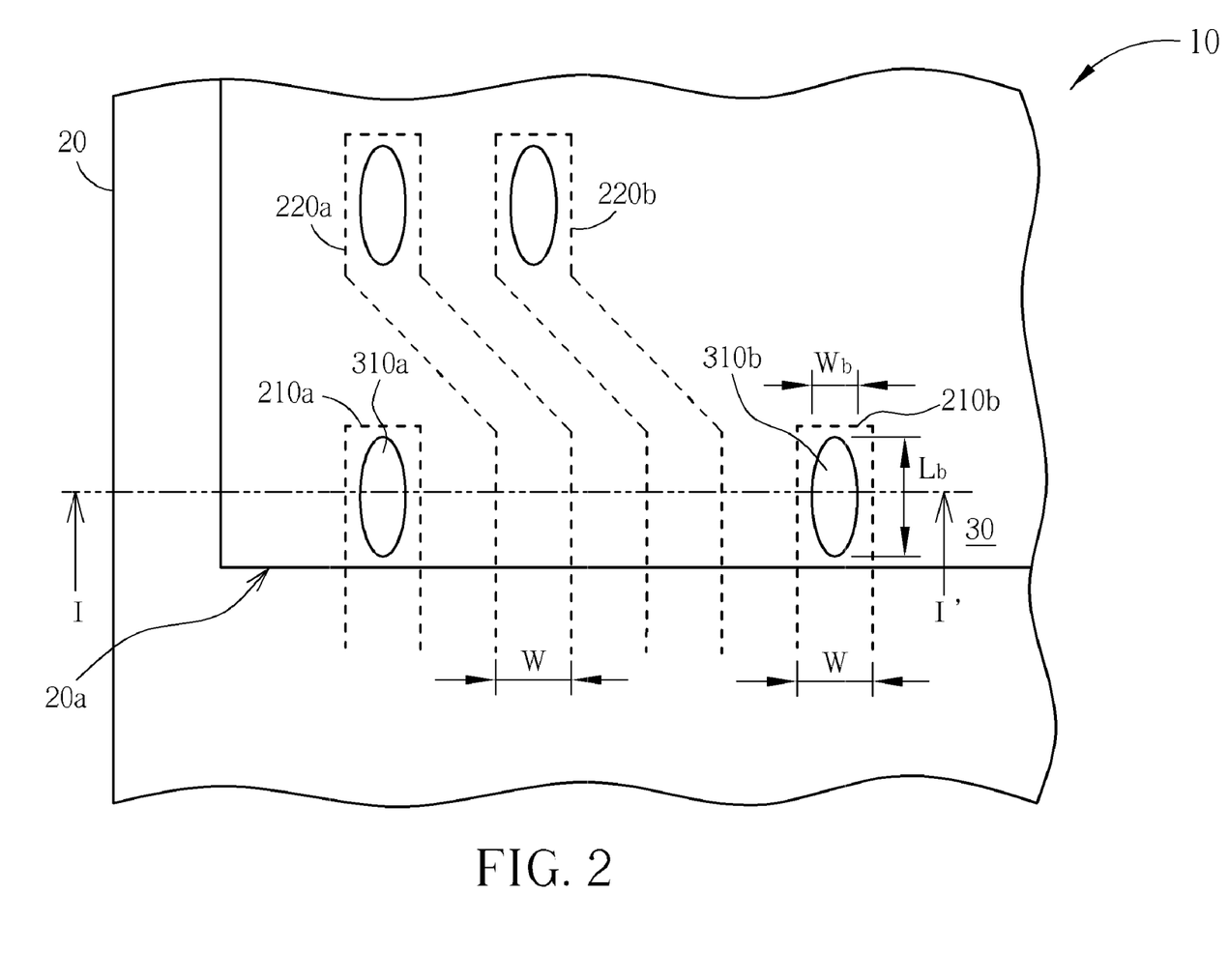
FIG. 2 is a plan view showing a portion of a flip chip package in accordance with one embodiment of this invention.
Figure 3:
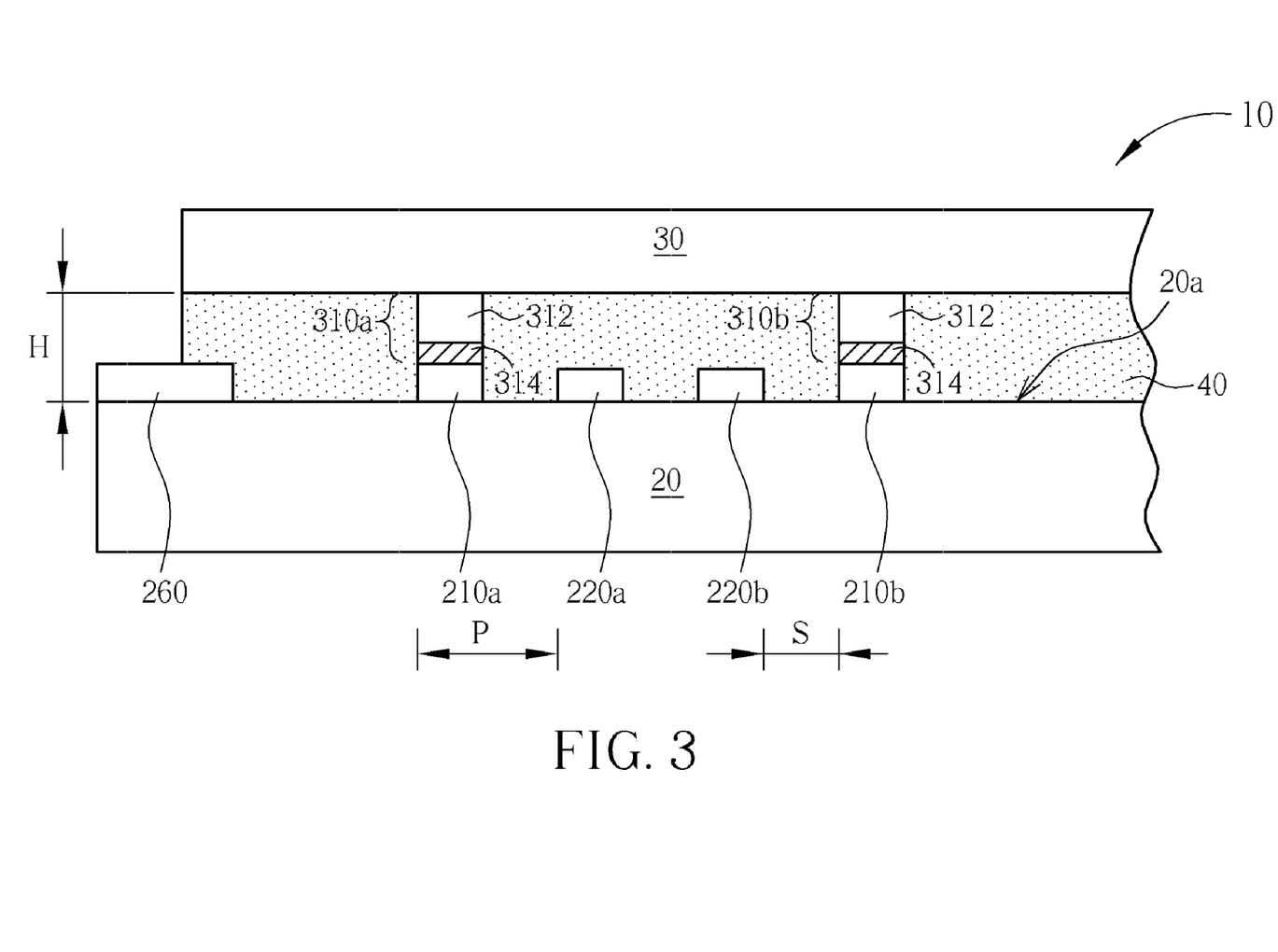
FIG. 3 is a partial sectional view taken along line I-I' in FIG. 2.

Please refer to FIG. 2 and FIG. 3. FIG. 2 is a plan view showing a portion of a flip chip package in accordance with one embodiment of this invention. FIG. 3 is a partial sectional view taken along line I-I' in FIG. 2. As shown in FIG. 2 and FIG. 3, the flip chip package 10 comprises a package substrate 20 having a die attach surface 20a. A plurality of traces 210a, 210b, 220a and 220b, which are indicated by dotted lines in FIG. 2, are disposed on the die attach surface 20a of the package substrate 20. According to the embodiment, at least one of the traces 210a, 210b, 220a and 220b may have a line width W between 10 µm and 40 µm, such as 25 µm and trace pitch P between 30 µm and 70 µm, such as 50 µm. According to the embodiment, the space S between two adjacent traces is between 10 µm and 40 µm, such as 25 µm.

The die attach surface 20a can be covered with a solder mask 260. According to the embodiment, the solder mask 260 can be composed of photosensitive material and can be patterned by photolithographic methods to partially expose the traces 210a, 210b, 220a and 220b and a portion of the die attach surface 20a. For example, the solder mask 260 within a predetermined open area that is directly under the die 30 may be removed to form an open solder mask or open solder resist configuration such that the traces 210a, 210b, 220a and 220b are exposed within the predetermined open area.

A semiconductor die or die 30 is mounted on the die attach surface 20a of the package substrate 20 with the active surface of the die 30 facing the package substrate 20. The circuitry of the die 30 is interconnected to the circuitry of the package substrate 20 via a novel trace bump trace (TBT) interconnection scheme. The TBT interconnection scheme features a plurality of lathy copper pillar bumps 310a and 310b disposed on the active surface of the die 30. At least one of the copper pillar bumps 310a and 310b may be composed of a metal stack comprising an UBM (under bump metallurgy) layer such as a sputtered UBM layer (not explicitly shown), a copper layer 312 such as a plated copper layer 312, and a solder cap 314. The detailed structure of copper pillar bumps 310a and 310b will be discussed later.

According to this embodiment, the copper pillar bumps 310a and 310b can be oval-shaped from a plan view, as can be best seen in FIG. 2. According to the embodiment, at least one of the copper pillar bumps 310a and 310b, when viewed from above, may have a rounded and slightly elongated outline extending along the fine trace. According to the embodiment, the bump width Wb of at least one of the copper pillar bumps, for example, the copper pillar bump 310b, is substantially equal to or smaller than the line width W of the trace, such as trace 210b, on the package substrate 20. In one embodiment, the bump length Lb of at least one of the copper pillar bumps, for example, the copper pillar bump 310b, may be at least two times greater than the line width W of the trace. By way of example, at least one of the copper pillar bumps 310a and 310b may have a bump width Wb between 10 µm and 40 µm, such as 25 µm and a bump length Lb between 40 µm and 80 µm, such as 60 µm. According to the embodiment, the die 30 may have a bump pitch between 120 µm and 180 µm, such as 150 µm.

Referring to FIG. 3, the copper pillar bumps 310a and 310b correspond to the traces 210a and 210b on the die attach surface 20a respectively. During the flip chip assembly, the two copper pillar bumps 310a and 310b, for example, are bonded onto the traces 210a and 210b, respectively. Due to the small size of the copper pillar bumps 310a and 310b, the stress is reduced, the bump-to-trace space is increased and the problem of bump-to-trace bridging can be effectively avoided. Furthermore, an increased routing space can be obtained. After the reflowing process, an underfill material or underfill 40 can be introduced into the gap between the die 30 and the package substrate 20 with an increased stand-off height H. The increased stand-off height H facilitates the underfill process. According to the embodiment, the underfill 40 may be capillary underfill (CUF), molded underfill (MUF) or a combination thereof.

Figure 4:
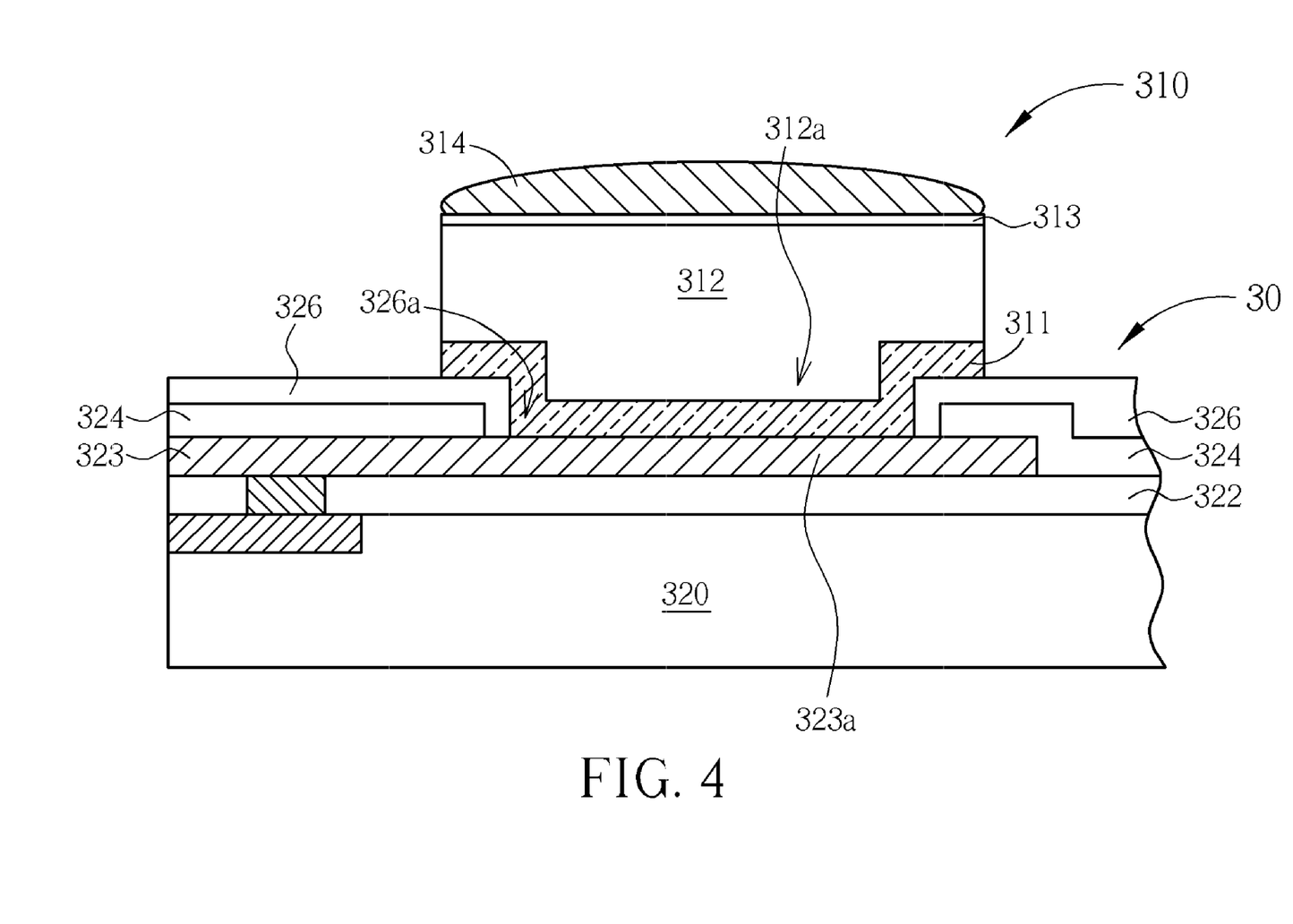
FIG. 4 is a schematic, cross-sectional diagram showing the detailed structure of the copper pillar bump on the active surface of the die according to one embodiment of this invention.

FIG. 4 is a schematic, cross-sectional diagram showing the detailed structure of the copper pillar bump on the active surface of the die according to one embodiment of this invention. The sectional view of the copper pillar bump is taken along the lengthwise direction of the copper pillar bump. As shown in FIG. 4, the die 30 may include a base 320, a first passivation layer 322 overlying the base 320, a topmost metal layer 323 overlying the first passivation layer 322, a second passivation layer 324 covering the topmost metal layer 323 and the first passivation layer 322, and a stress buffering layer 326 overlying the second passivation layer 324. The term "overlying" can mean, but is not limited to, "on" or "over". According to the embodiment, the base 320 may include but not limited to a semiconductor substrate, circuit elements fabricated on a main surface of the semiconductor substrate, inter-layer dielectric (ILD) layers and interconnection. The first passivation layer 322 may comprise but not limited to silicon nitride, silicon oxide, silicon oxynitride or any combination thereof. The second passivation layer 324 may comprise but not limited to silicon nitride, silicon oxide, silicon oxynitride or any combination thereof. The stress buffering layer 326 may comprise but not limited to polyimide, polybenzoxazole (PBO) or a combination thereof. The topmost metal layer 323 may comprise but not limited to aluminum, copper or alloys thereof. The stress buffering layer 326 may include the second passivation layer 324.

An opening 326a can be formed in the stress buffering layer 326 to expose at least a portion of the topmost metal layer 323. The opening 326a can be of any shape. According to the embodiment, the opening 326 may be a lathy, oval-shaped opening elongating along the lengthwise direction of the copper pillar bump. An UBM layer 311 can be formed on the exposed topmost metal layer 323 within the opening 326a. The UBM layer 311 may also extend onto a top surface of the stress buffering layer 326. According to the embodiment, the UBM layer 311 may be formed by sputtering methods and may comprise titanium, copper or a combination thereof. For example, the UBM layer 311 may include a titanium layer having a thickness between 500 angstroms and 1500 angstroms such as 1000 angstroms and a copper layer having a thickness between 3000 angstroms and 7000 angstroms such as 5000 angstroms. A copper layer 312 such as an electroplated copper layer can be formed on the UBM layer 311. According to the embodiment, the copper layer 312 may have a thickness between 30 µm and 60 µm, such as 45 µm. The opening 326 can be filled with the copper layer 312 and the UBM layer 311, and the copper layer 312 and the UBM layer 311 within the opening 326 may form an integral plug 312a that electrically couples the copper pillar bump 310 with the underlying topmost metal layer 323. A solder cap 314 having a thickness between 10 µm and 40 µm, such as 25 µm can be formed on the copper layer 312. A nickel layer 313 having a thickness between 1 µm and 5 µm, such as 3 µm may be formed between the copper layer 312 and the solder cap 314. The copper layer, such as copper layer 312, may be a part of a re-distribution layer (RDL) or may be fabricated concurrently with the RDL.

Figure 5:
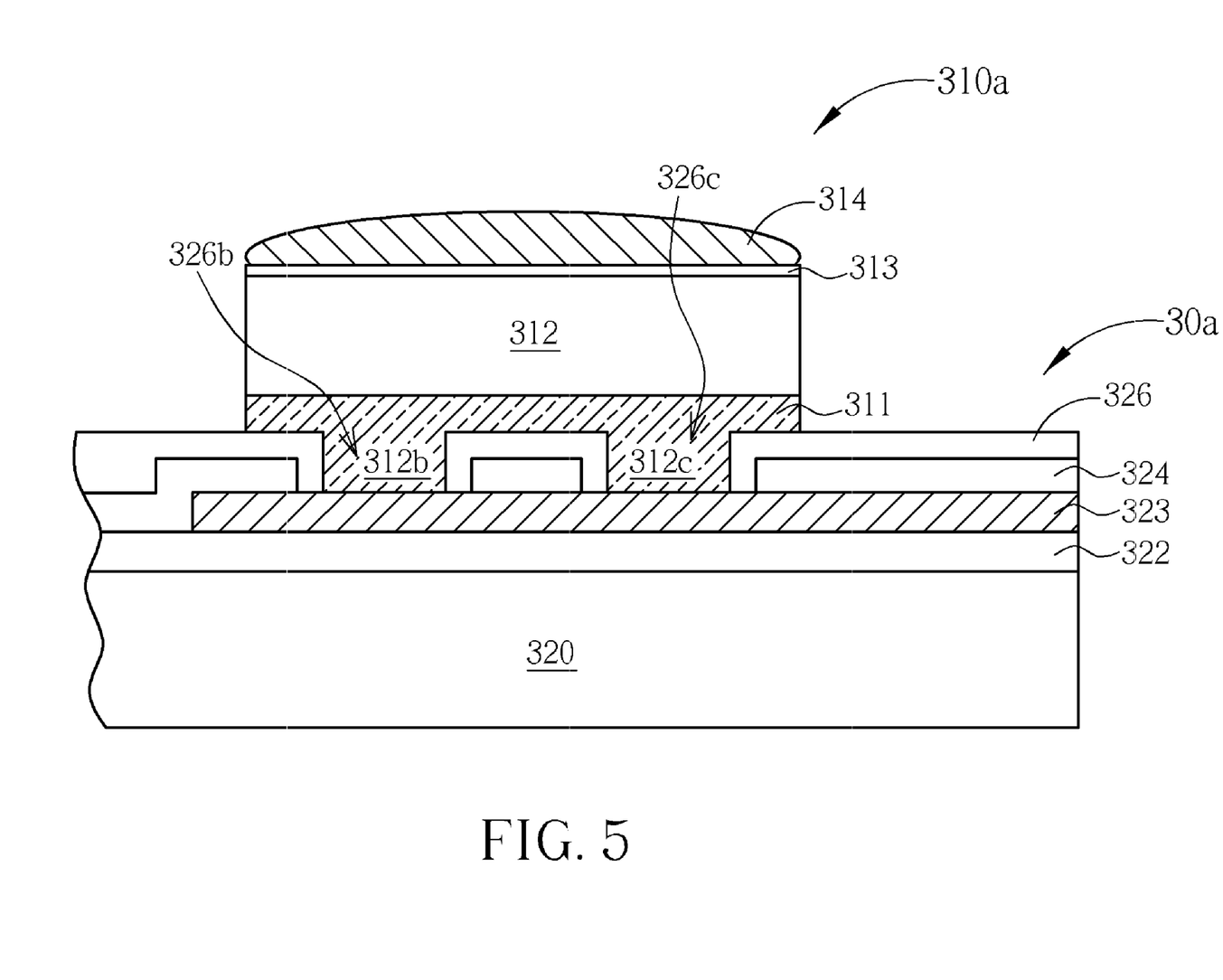
FIG. 5 is a schematic, cross-sectional diagram showing the detailed structure of the copper pillar bump on the active surface of the die according to another embodiment of this invention.

FIG. 5 is a schematic, cross-sectional diagram showing the detailed structure of the copper pillar bump on the active surface of the die according to another embodiment of this invention. Likewise, the sectional view of the copper pillar bump is taken along the lengthwise direction of the copper pillar bump. As shown in FIG. 5, the die 30a may include a base 320, a first passivation layer 322 overlying the base 320, a topmost metal layer 323 overlying the first passivation layer 322, a second passivation layer 324 covering the topmost metal layer 323 and the first passivation layer 322, and a stress buffering layer 326 overlying the second passivation layer 324. According to the embodiment, the base 320 may include but not limited to a semiconductor substrate, circuit elements fabricated on a main surface of the semiconductor substrate, inter-layer dielectric (ILD) layers and interconnection. Two openings 326b and 326c can be formed in the stress buffering layer 326 to expose portions of the topmost metal layer 323. The openings 326b and 326c can be of any shape. An UBM layer 311 can be formed on the exposed topmost metal layer 323 within the openings 326b and 326c. The UBM layer 311 may fill the openings 326b and 326c and may extend onto a top surface of the stress buffering layer 326. According to the embodiment, the UBM layer 311 may be formed by sputtering methods and may comprise titanium, copper or a combination thereof. The UBM layer 311 may include a titanium layer having a thickness between 500 angstroms and 1500 angstroms such as 1000 angstroms and a copper layer having a thickness between 3000 angstroms and 7000 angstroms such as 5000 angstroms. A copper layer 312 such as an electroplated copper layer 312 can be formed on the UBM layer 311. At least the UBM layer 311 within the openings 326b and 326c may form dual integral plugs 312b and 312c that electrically couple the copper pillar bump 310a with the underlying topmost metal layer 323. A solder cap 314 can be formed on the copper layer 312. A nickel layer 313 may be formed between the copper layer 312 and the solder cap 314.

Figure 6:
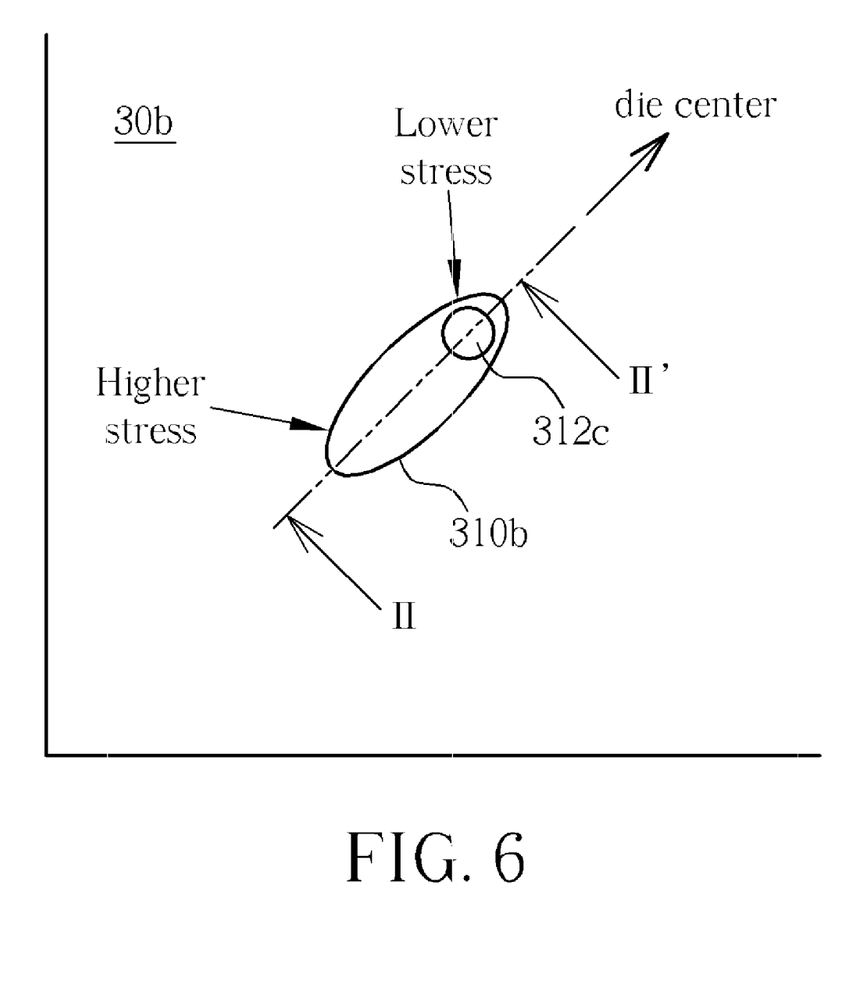
FIG. 6 is a plan view of an exemplary copper pillar bump on the active surface of the die in accordance with still another embodiment of this invention.
Figure 7:
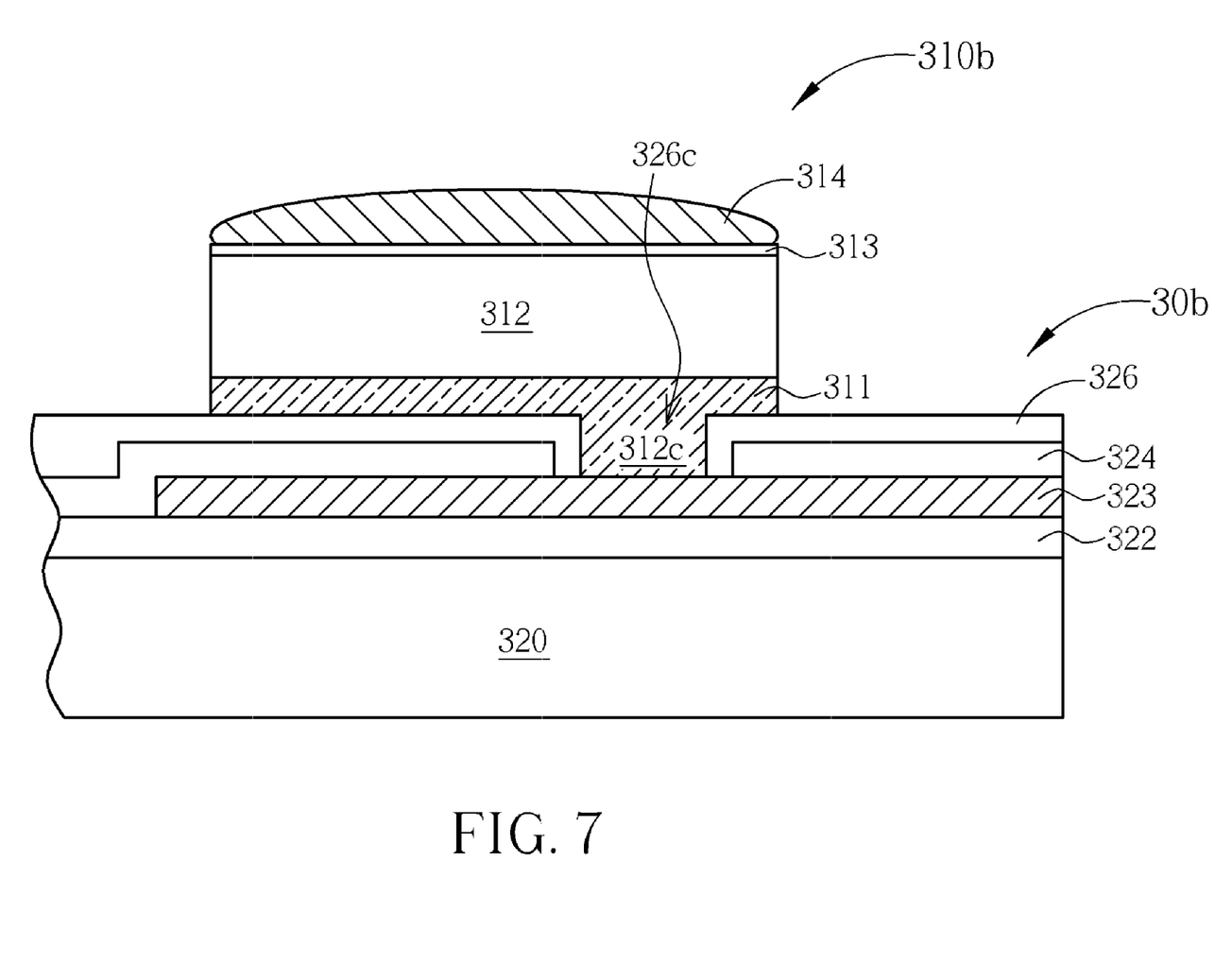
FIG. 7 is a schematic, cross-sectional view of the exemplary copper pillar bump taken along line II-II' in FIG. 6.

The bump orientation is another feature of the invention. FIG. 6 is a plan view showing an exemplary bump orientation on the active surface of the die in accordance with still another embodiment of this invention, and FIG. 7 is a schematic, cross-sectional view of the exemplary copper pillar bump taken along line II-II' in FIG. 6, wherein like numeral numbers designate like regions, layers or elements. FIG. 6 is a partial view of a die corner and only one bump is shown for the sake of simplicity. As shown in FIG. 6, the copper pillar bump 310b in this embodiment is oval-shaped from a plan view and has a rounded and slightly elongated outline extending along the lengthwise direction of the bump. In this embodiment, the lengthwise direction, namely the bump orientation, of the copper pillar bump 310b is directed to the center of the die 30b. According to the embodiment, the copper pillar bump 310b has an asymmetric plug configuration along the lengthwise direction of the bump. More specifically, an integral plug 312c is disposed on the lower stress side as indicated by the arrow, while on the higher stress side that is farther away from the die center, no plug is provided.

The detailed structure of the asymmetric plug configuration of the copper pillar bump 310b on the die 30b can be seen in FIG. 7. As shown in FIG. 7, likewise, the die 30b comprises a base 320, a first passivation layer 322 overlying the base 320, a topmost metal layer 323 overlying the first passivation layer 322, a second passivation layer 324 covering the topmost metal layer 323 and the first passivation layer 322, and a stress buffering layer 326 overlying the second passivation layer 324. According to the embodiment, the base 320 may include but not limited to a semiconductor substrate, circuit elements fabricated on a main surface of the semiconductor substrate, inter-layer dielectric (ILD) layers and interconnection. One opening 326c is formed on the lower stress side, i.e., the side that is closer to the die center, in the stress buffering layer 326 to expose a portion of the topmost metal layer 323. The opening 326c can be of any shape. An UBM layer 311 can be formed on the exposed topmost metal layer 323 within the opening 326c. The UBM layer 311 may fill the opening 326c and may extend onto a top surface of the stress buffering layer 326. According to the embodiment, the UBM layer 311 may be formed by sputtering methods and may comprise titanium, copper or a combination thereof. The UBM layer 311 may include a titanium layer having a thickness between 500 angstroms and 1500 angstroms such as 1000 angstroms and a copper layer having a thickness between 3000 angstroms and 7000 angstroms such as 5000 angstroms. A copper layer 312 such as an electroplated copper layer can be formed on the UBM layer 311. At least the UBM layer 311 within the opening 326c may form an integral plug 312c that electrically couple the copper pillar bump 310b with the underlying topmost metal layer 323. A solder cap 314 can be formed on the copper layer 312. A nickel layer 313 may be formed between the copper layer 312 and the solder cap 314. Since the integrity of the stress buffering layer 326 on the higher stress side, i.e., the side that is farther away form the die center, is not damaged by the plug and via opening, the underlying extra-low k (ELK) dielectric or ultra-low k (ULK) dielectric in the base 320 can be effectively protected against the stress due to, for example, thermal expansion or wafer warpage. It is another advantage to use such bump orientation as depicted in FIG. 6 and FIG. 7 because a better routing ability can be obtained. With such orientation, the space between two adjacent bumps can be increased such that more traces can pass therethrough.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip chip package, comprising:
a substrate having a die attach surface; and
a die mounted on the die attach surface with an active surface of the die facing the substrate, wherein the die is interconnected to the substrate via a plurality of copper pillar bumps on the active surface, wherein at least one of the plurality of copper pillar bumps has a bump width that is substantially equal to or smaller than a line width of a trace on the die attach surface of the substrate, wherein the at least one of the plurality of copper pillar bumps is jointed to the trace without using a via in the substrate.

2. The flip chip package according to claim 1 wherein at least one of the plurality of copper pillar bumps has a bump length that is at least two times greater than the line width of the trace.

3. The flip chip package according to claim 1 wherein at least one of the plurality of copper pillar bumps is oval-shaped from a plan view.

4. The flip chip package according to claim 1 wherein the line width of the trace is between 10 μm and 40 μm.

5. The flip chip package according to claim 1 wherein the die has a bump pitch between 120 μm and 180 μm.

6. The flip chip package according to claim 1 wherein at least one of the plurality of copper pillar bumps has a bump width between 10 μm and 40 μm and a bump length between 40 μm and 80 μm.

7. The flip chip package according to claim 1 wherein at least one of the plurality of copper pillar bumps has a bump orientation that is directed to a center of the die.

8. The flip chip package according to claim 1 further comprising an underfill between the die and the substrate.

9. The flip chip package according to claim 8 wherein the underfill comprises capillary underfill (CUF), molded underfill (MUF) or a combination thereof.

10. The flip chip package according to claim 1 wherein at least one of the plurality of copper pillar bumps is composed of a metal stack comprising an UBM layer, a copper layer, and a solder cap.

11. The flip chip package according to claim 10 wherein the copper layer has a thickness between 30 μm and 60 μm.

12. The flip chip package according to claim 10 wherein the solder cap has a thickness between 10 μm and 40 μm.

13. The flip chip package according to claim 10 wherein at least one of the plurality of copper pillar bumps further comprises a nickel layer between the copper layer and the solder cap.

14. A semiconductor die, comprising:
a base;
a topmost metal layer on the base;
a stress buffering layer overlying the topmost metal layer, wherein the stress buffering layer has an opening exposing at least a portion of the topmost metal layer; and
a copper pillar bump coupled to the topmost metal layer through the opening, wherein the copper pillar bump has an elongated outline along a lengthwise direction of the copper pillar bump, and wherein the lengthwise direction is directed to a center of the semiconductor die.

15. The semiconductor die according to claim 14 wherein the copper pillar bump is oval-shaped from a plan view.

16. The semiconductor die according to claim 14 wherein the copper pillar bump has a bump width between 10 μm and 40 μm and a bump length between 40 μm and 80 μm.

17. The semiconductor die according to claim 14 wherein the copper pillar bump has a lower stress side and a higher stress side, and the opening is situated closer to the lower stress side and is farther from the higher stress side.

18. The semiconductor die according to claim 14 wherein the copper pillar bump is composed of a metal stack comprising an UBM layer, a copper layer, and a solder cap.

19. The semiconductor die according to claim 18 wherein the copper layer has a thickness between 30 μm and 60 μm.

20. The semiconductor die according to claim 18 wherein the solder cap has a thickness between 10 μm and 40 μm.

* * * * *